(12) United States Patent
Fitch et al.

(10) Patent No.: US 8,765,215 B1
(45) Date of Patent: Jul. 1, 2014

(54) NON-MECHANICALLY CREATED IRIDESCENT FILM

(75) Inventors: John Fitch, Middletown, RI (US); Jan Moritz, Bristol, RI (US)

(73) Assignee: Toray Plastics (America), Inc., North Kingstown, RI (US)

( * ) Notice: Subject to any disclaimer, the term of this patent is extended or adjusted under 35 U.S.C. 154(b) by 228 days.

(21) Appl. No.: 13/299,071

(22) Filed: Nov. 17, 2011

(51) Int. Cl.
*B05D 5/06* (2006.01)

(52) U.S. Cl.
USPC ............ 427/162; 427/164; 427/250; 427/251

(58) Field of Classification Search
CPC .......... B05D 5/06; B05D 5/061; B05D 5/065; G02B 1/04; G02B 5/18; C23C 14/00; C23C 14/024; C23C 14/20
USPC .................. 427/162, 164, 250, 251
See application file for complete search history.

(56) References Cited

U.S. PATENT DOCUMENTS

| | | | |
|---|---|---|---|
| 3,235,399 A | 9/1962 | Martin, Jr. | |
| 3,766,061 A | 10/1973 | Mahler et al. | |
| 3,914,472 A * | 10/1975 | Nakanishi et al. | 427/250 |
| 5,182,157 A * | 1/1993 | Fitch | 428/137 |
| 6,018,902 A | 2/2000 | Gudermuth et al. | |
| 6,391,425 B1 * | 5/2002 | Migliorini et al. | 428/172 |
| 6,706,387 B2 | 3/2004 | Butera et al. | |
| 6,737,170 B2 * | 5/2004 | Fitch et al. | 428/480 |
| 7,150,923 B2 | 12/2006 | Goodrich et al. | |
| 7,157,135 B2 * | 1/2007 | Decker et al. | 428/212 |
| 2008/0038539 A1 | 2/2008 | Yokota et al. | |

* cited by examiner

*Primary Examiner* — Elizabeth Burkhart
(74) *Attorney, Agent, or Firm* — Jeffrey C. Lew

(57) ABSTRACT

The novel method can produce a grooved profile metalized polymeric film capable of generating a rainbow iridescent effect without mechanically embossing the film. The method calls for applying a thin uniform thickness coating layer of thermally deformable polymer composition on a thermally stable base layer. Process operating conditions are controlled to heat the composite coating layer surface effectively such that light diffraction-scale grooves of about 5,000-10,000 grooves/cm develop in the coating layer. The grooves are created by shocking the coating layer surface with a sudden burst of heat supplied by film metalization after coating layer application.

14 Claims, 4 Drawing Sheets

NON-MECHANICALLY CREATED IRIDESCENT FILM

FIELD OF THE INVENTION

This invention relates to a method of making a metalized polymeric coating having rainbow iridescence. More specifically it relates to thermally forming a polymeric coating with surface grooves that when metalized, is effective to exhibit iridescence for packaging and decorative utilities.

BACKGROUND OF THE INVENTION

Iridescent coatings are useful in a diverse range of currently commercially significant products. These include credit cards, membership materials, board laminates, labels, toys, packaging materials, holographic imaging, and advertising displays to name a few examples.

Various techniques have been developed to produce iridescent effects for decorative and functional purposes on different articles of manufacture. These methods are highly specific in applicability to narrow ranges of chemical compositions and complex physical structures.

U.S. Pat. No. 3,235,399 discloses a method of creating a nacreous effect on polyvinyl chloride ("PVC") by coating the PVC with a 0.1 to 1.5 wt % dispersion of mica flake in PVC and then solidifying the dispersion.

U.S. Pat. No. 3,766,061 teaches a procedure for generating striking optical properties for decorative uses by coating an object with a mixture of ester derivatives of cholesterol or cholesterol-like sterols.

U.S. Pat. No. 6,018,902 discloses a method of making iridescent reflective fishing lures by applying an optical stack of a plurality of dielectric film layers on a base layer. The optical stack comprises an odd number of layers numbering at least three. The first, third, etc. layers comprise the same reflective material which differs from the reflective material of the second, fourth, etc. layers.

A different technique known in the art involves forming an iridescent coating that comprises a textured base layer with a light diffracting surface contour. That is, the surface defines many micro-size impressions, usually grooves, in the thousands per centimeter peak-to-peak spacing range. Often the base layer is polymeric. To create an enhanced, high contrast iridescence on the polymer, the textured base layer surface can be metalized with an ultra-thin layer of a reflective metal.

Traditionally the grooves are formed by a mechanical technique, such as embossing. The base layer is impressed by a tool bearing an inverted, negative relief, groove profile. Under conditions of heat and pressure the positive relief groove profile is transferred to the base layer. Usually the impressions are formed by passing the base layer through the nip between a precisely machined embossing roll and a back-up tool. Embossing rolls with very fine negative relief groove profiles can be difficult and expensive to manufacture and are delicate once made. Moreover, the act of embossing grooves into the base layer adds an extra procedural step to the iridescent film production process.

It is desirable to have a method of making an iridescent film that is suitable for use with a broad range of base layer compositions and operating conditions. An iridescent film fabrication procedure that avoids the need to utilize many different layers is also desired. There is a need to produce an iridescent grooved surface on a polymer film without an extra, mechanical embossing step. Such non-mechanical groove-forming method beneficially would also eliminate the need to provide an expensive, precisely machined embossing roll. A procedure for making iridescent film that can be carried out on existing equipment without significant mechanical modifications or material changes is very much wanted.

SUMMARY OF THE INVENTION

The novel method can produce a grooved profile metalized polymeric film capable of generating a rainbow iridescent effect without mechanically embossing the film. The method calls for applying a thin uniform thickness coating layer of thermally deformable polymer composition on a thermally stable base layer. Process operating conditions are controlled to heat the composite coating layer surface effectively such that light diffraction-scale grooves of about 5,000-10,000 grooves/cm develop in the coating layer. The grooves are created by shocking the coating layer surface with a sudden burst of heat supplied by film metalization after coating layer application.

Accordingly, the present invention provides A method of producing a film that exhibits rainbow iridescence comprising the steps of (A) providing a base layer of a polymer having a softening temperature above 200° C., (B) applying a coating layer of a polymer having a glass transition temperature in the range of about 30-55° C. in direct contact with one side of the base layer, and (C) depositing a metal layer in direct contact with the coating layer on a side opposite the base layer, in which at least one of (i) the applying step, and (ii) the depositing step, comprises utilizing operating conditions that heat the film effectively to create a grooved surface profile on the coating layer having peak-to-peak spacing of about 5,000-10,000 per cm.

DETAILED DESCRIPTION OF THE INVENTION

This invention is directed primarily to so-called "rainbow" iridescent films. Decorative iridescent effect is commonly generated by light reflecting from fine, three-dimensionally patterned surfaces. The patterns can be complex with resulting iridescent effects being intricate. Rainbow iridescence is a quite common and very commercially significant visual effect resulting from surface patterns that are basically narrowly spaced apart, substantially linear grooves.

Figure 1A:
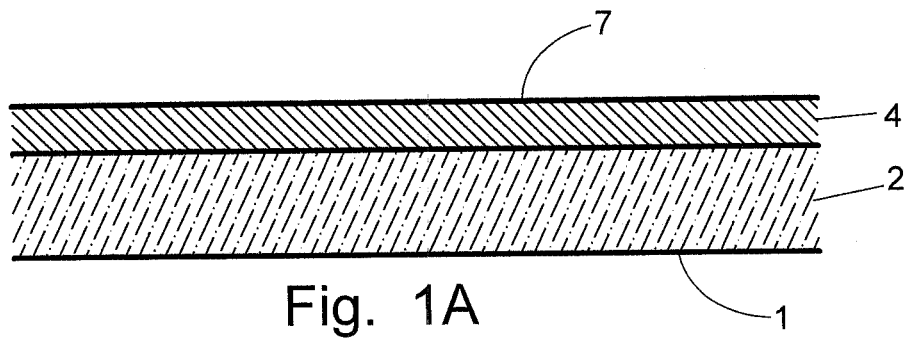
FIG. 1A is a schematic elevation cross section diagram of a precursor form of an iridescent film at an early stage of fabrication according to an embodiment of this invention.
Figure 1B:
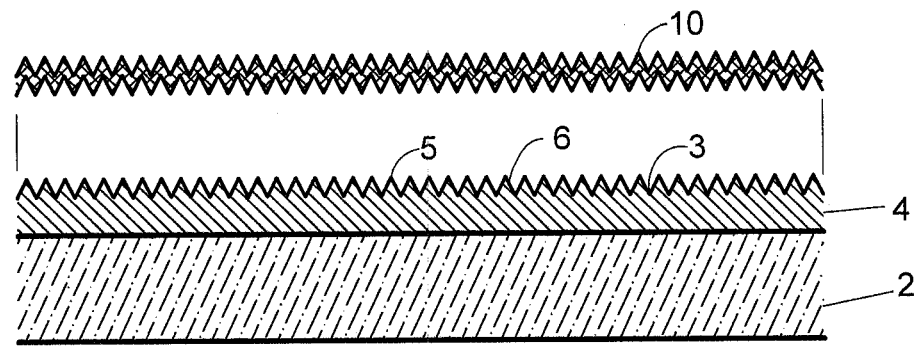
FIG. 1B is a schematic elevation cross section diagram of a precursor form of an iridescent film at an intermediate stage of a traditional fabrication method in which an early stage precursor form as in FIG. 1A is mechanically impressed to have a grooved surface.
Figure 1C:
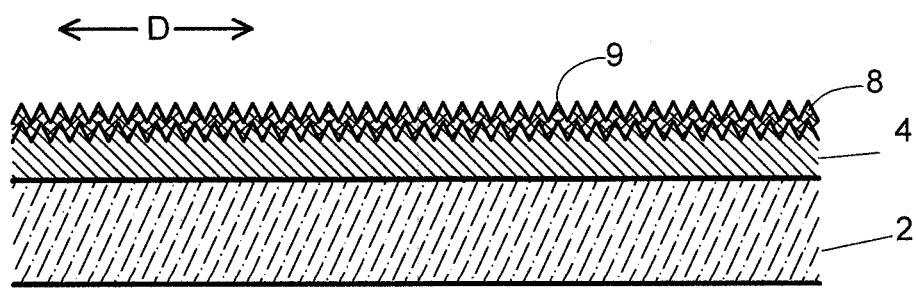
FIG. 1C is a schematic elevation cross section diagram of a completed iridescent film fabricated from the precursor form of FIG. 1A according to an embodiment of this invention.

The novel process can be understood by reference to FIGS. 1A-1C which illustrate sections of a rainbow iridescent film according to this invention in various stages of fabrication. FIG. 1A shows a precursor of the film that includes a polymeric base layer 2 with a polymeric coating layer 4 on one side thereof. The base layer functions to carry the coating layer and additional layer or layers to be applied during fabrication and use of the film. The coating layer is a medium that can be formed to a three-dimensional surface profile adapted to generate iridescent optical effects. It also serves as an adhesive link between the base layer and any optional metal coating to be applied to the film for enhanced brightness. contrast and/or decorative effect. These figures show a cross section of a representative film portion viewed in a direction parallel to the plane of the film and longitudinally with the substantially linear grooves. Preferably the film is formed continuously in an endless web that would extend to left and right of the figure to non-specific but finite extent. The process is also suitable for making rainbow iridescent film in discrete-sized, sheet form.

The base layer can be made continuously by conventional thermal processing techniques such as film extrusion, blow-molding and the like starting from granular or pelletized polymer feed material. Generally in such processes well known in the art, solid polymer particles are melted in a heated extruder and expelled through a die as a thin molten web. The web is quenched to solidify the film which can be isolated as extruded or further processed, such as by monoaxial or biaxial stretching to make the film thinner. The coating layer is also formed on the base layer by conventional methods. Depending on the composition, the coating layer can be formed by thermal processes such as coextrusion onto the base layer, extrusion of a coating layer film coupled with lamination to the base layer or by solvent-based processes. In the latter, coating layer polymer is dissolved in solution with a liquid solvent, the solution is deposited onto a side of the base layer and the solvent is removed. Conventional solution deposition techniques such as spraying, painting, dipping, doctoring, rod coating and the like can be used. As seen in the figures, the base layer and coating layer as initially formed have substantially uniform thicknesses. The exposed surface 7 of the coating layer is smooth.

In traditional methods of making light diffraction-scale groove patterns for optical effects, the grooves are formed by mechanical techniques. Usually embossing is used in which a negative relief, grooved embossing tool is pressed against the smooth outer surface of the coating layer 7 while optionally mildly heating the coating layer enough to soften and to receive the impression of the embossing tool. In such processes, a flat, backing tool is typically biased against the base layer on opposite side 1.

FIG. 1B illustrates an intermediate stage of fabrication of a conventional rainbow iridescent film. Beginning with a base layer 2/coating layer 4 composite film like that of FIG. 1A, exposed smooth surface 7 (FIG. 1A) is impressed by a mechanical embossing tool (not shown) to produce a grooved profile 6. The tool is forced with heat and pressure against the coating layer surface. The grooves are defined by valleys 3 and peaks (between adjacent valleys) 5. The figure schematically illustrates the grooves as having sawtooth shape with flat slopes, narrow valleys and sharp peaks. Actual grooves may have rounded peaks, or valleys and irregularly sloped sides.

To obtain brighter and more highly contrasted rainbow iridescent effect, an optional, reflective material, preferably metal, can be placed onto the surface of the web of the coating layer. Traditionally, the coating layer surface 6 is metalized after mechanical after the grooves have been formed. FIG. 1B symbolically shows a layer 10 of metal as it would be positioned on coating layer 6.

The metal layer is ultra-thin thus it is not normally placed on the coating layer in strip form as depicted in the figure. The metal layer is thin so that it can conform to the contours of the very small grooves so that it fulfills the primary purpose of increasing reflection of light from the grooved surface and brighten the iridescent effect. Usually, the metal layer is built up on the coating layer by a molecular deposition process such as by metal molecules condensing from vapor onto the coating layer surface, as will be explained. The thickness of the metal layer is so thin that it is often quantified indirectly by an "optical density" measurement. Optical density refers to the ability of an element to absorb incident light. The greater the optical density, the more light that is filtered by the element. The greater the thickness of the metal layer, the higher the optical density. Consequently, the thickness of the metal layer can determined by analyzing light transmission by optical density measurement through a sample of the film. The optical density of metalized film in rainbow iridescent film applications is typically 1.8-2.5. Optical density is determined by method CMP OD-1.

In contrast, the rainbow iridescent film according to this invention is formed differently as represented by FIG. 1C. This figure shows a completed metalized composite rainbow iridescent film made directly from precursor web of FIG. 1A. Unlike the conventional film, the uniformly thick coating layer is not mechanically embossed prior to adding the metal layer. When metalization begins, the surface 7 of the coating layer is smooth. FIG. 1C shows that the film bears a metal layer 8 on coating layer 4. The grooved surface profile 9 is formed contemporaneously with and largely as a result of the metalization step of the iridescent film formation process. As will be further explained, the heat associated with the metal deposition process causes the uniformly thick, coating layer 4 to buckle so as to form the grooves spontaneously without mechanical intervention. Condensing metal molecules adhere to the grooved coating layer surface and provide an ultra thin metal layer 8 conforming to the grooved coating layer surface seen in FIG. 1C.

An important beneficial feature of this invention is that it can be practiced with equipment and materials traditionally in use for iridescent film fabrication. As will be explained, the same well known composite film forming and metalizing equipment as in current use can be adapted for operating the method of the present invention. Of course, the mechanical impression of grooves in the coating layer is advantageously no longer necessary. Therefore, this old step is eliminated by the present invention.

It also is true that the novel method can employ generally the same materials used in conventional metalized iridescent film manufacture. The base layer film composition is predominantly polymeric. The polymer composition should be thermally stable up to at least about 100° C., preferably 180° C., more preferably 200° C., and most preferably 220° C. By thermally stable is meant that the polymer is in the solid state, dimensionally stable, non-tacky, and not destructively reactive, i.e., non-degrading, in an ambient atmosphere. The novel film polymer layer optionally can be stretched in one or both orthogonal planar directions, i.e., machine direction and transverse direction, similar to the extent of conventionally produced iridescent film bases. Stretching provides thickness control and permits orientation of the polymer for structural strength enhancement. Optionally stretched base layer can be heat treated to set its morphological orientation. Preferably polyethylene terephthalate base layer for iridescent film applications can be biaxially stretched in the 2×-6× range.

The base layer can also be stretched after application of coating layer. Thus the base layer and coating layer are stretched together. A composite with polyester base layer typically can be stretched to up to about 4×. A composite with polypropylene base layer can be stretched up to about 10×.

Representative polymeric compositions for use as the base layer of the composite film include, polyimides, polysulfones, polycarbonates, polyesters, polyamides, polyureas, poly(ether-amides), poly(hydroxy acids), acrylic polymer, polyolefins, polyurethane and blends thereof. Polyester is a preferred composition. and polyethylene terephthalate is more particularly preferred.

The coating layer is also mainly polymeric and can be selected from conventional among polymer compositions used for the mechanically grooved metal supporting layer of traditionally formed iridescent film coatings. Preferably the polymeric composition for the coating layer has a glass transition temperature in the range of about 30° C.-55° C. Preferred compositions are styrene acrylic polymer, polyolefins and polyurethane. Styrene acrylic polymer is a copolymer of styrene monomer and acrylic and/or acrylate comonomer. Styrene acrylic polymer is much preferred.

Any metal composition conventionally used in metalized film coating for optical purposes can be utilized. Aluminum is preferred. Thickness of the metal layer is preferably about 250-450 angstroms (25-45 nm) and corresponds approximately to an optical density of about 3-3.5.

To create a rainbow iridescent effect, the dimensions and spacing of the grooves is on a microcosmic scale. Typically, the grooves are very numerous such that the spacing of grooves provides about 2,000-15,000 grooves per cm (in direction represented by arrow D), and preferably about 5,000-10,000 grooves per cm.

The method of this invention advantageously eliminates mechanical embossing techniques of conventional methods to form the grooves. Instead, metalization procedures, explained below, are used with operating conditions that cause the grooves to form spontaneously. Generally, the grooves are formed as a consequence of sudden exposure of the coating layer surface to a large burst of heat energy associated with the latent heat of condensing metal vapor. The precise mechanism for groove formation is not thoroughly understood. Without wishing to be bound to any particular theory, it is contemplated that exposing the smooth coating layer surface to hot metal vapor at appropriate rate of metal condensation on the surface causes coating layer to buckle and form grooves. The grooves form without mechanically impressing a pattern into the coating layer.

The procedures used according to this invention to obtain a micro-scale grooved surface topography can be beneficially practiced with conventional types of metal deposition unit operations. Among these techniques, vacuum metal deposition is preferred. More specifically, in vacuum metal deposition, solid or liquid metal to be deposited is vaporized in a subatmospheric pressure environment surrounding the object to receive the metal. Metal vapor contacts, condenses and fuses onto the object surface giving up sensible heat and heat of phase transformation to the environment, including the object.

The deposition step operating conditions are modified from conventional conditions to cause groove formation. Basically, conditions are set to expose the surface of the coating layer to more heat than in traditional metal coating operations in which metalizing of a mechanically grooved surface is performed. However, the novel technique goes beyond merely heating the composite base layer/coating layer film more than before. That would likely cause the coating layer to soften and liquefy. It could also weaken and damage the integrity of the composite film. This invention calls for heating the surface of the coating layer with a sudden short burst of heat energy primarily at the surface of the coating layer. It is thought that this heat blast generates the grooved structure while simultaneously metalizing the coating layer to make a product that gives similar visual appearance of conventionally made rainbow iridescent films.

Figure 2:
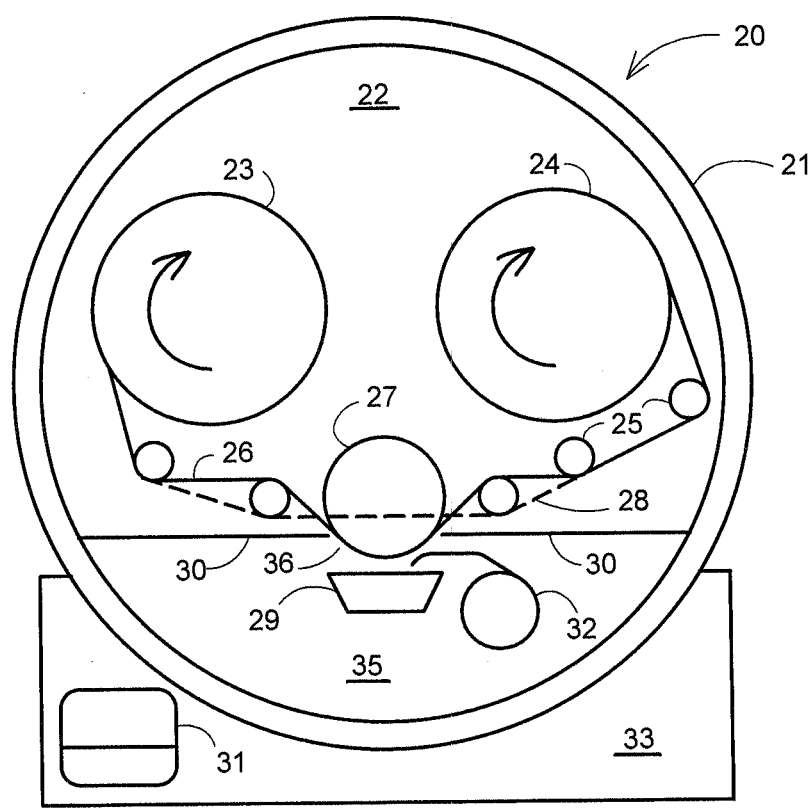
FIG. 2 is a schematic diagram of an apparatus suitable for fabricating an iridescent film according to this invention.

A schematic diagram of a typical roll-to-roll style apparatus 20 for vacuum metal deposition is shown in FIG. 2. Metal deposition is carried out in chambers maintained under vacuum within a cylindrical housing 21 mounted on base 33. A control system 31 is provided to process instrument displays and operating condition controls. The interior is divided by traverse plate 30 into upper chamber 22 and lower chamber 35. An open space slot 36 exists in the central region of the traverse plate. The slot provides vapor communication between upper and lower chambers. One or more open-topped intermetallic containers, 29, occasionally referred to as "boats" or "evaporators" are positioned in lower chamber 35. Metal wire 32 is supplied to the boats from a spool at a rate controlled by a feed mechanism, not shown. The boats are heated, typically by resistive heating elements to melt the metal. The atmosphere within the lower chamber thus contains metal vapor generated by the liquid metal of the boats. The number of boats depends on the web width. The boats are evenly distributed across the web to achieve uniform evaporation and deposition on the web surface.

In the apparatus for a film vacuum metalizing process of FIG. 2, a coating layer-bearing base layer composite precursor film is prefabricated, wound up and supplied to the metalizing unit operations on a roll. The upper chamber 22 contains roll to roll film winding 23 and unwinding 24 mechanisms. The web that is being metalized is initially wound-up on roll 24. The roll is rotated in the direction of the arrow such that web (solid line) 26 is unwound and passed over idler rollers 25 and in contact with cooling drum 27. After contacting the cooling drum, the web is further guided by additional idler rolls and wound up on winding roll 23 rotating in the direction of the arrow. A part of the cooling drum is positioned to protrude through slot 36 formed between the two sides of traverse plate 30. Typically the evaporators are located about 150-250 mm below the cooling drum. Coolant medium, usually water or brine at a temperature in the range of about −25° C. to about 0° C., is made to pass through the cooling such that the surface of this drum is lower than the atmospheric temperature within the housing 21. Thus the web being coated is forced into the lower chamber 35 by the cooling drum. While the web backed by the cooling drum is within the atmosphere of lower chamber 35, metal vapor condenses and solidifies on the exposed web surface. The thus metalized film then is accumulated on the winding roll 23. This process is known in the art as "drum metalizing".

In a different metalizing method, known as "span metalizing", a cooling drum is not deployed. The web path in span metalization is shown by the dashed line 28 in FIG. 2. The web thus travels across slot 36 in proximity to traverse plate 30 without being backed by a cooling roller. The atmosphere in lower chamber 35 is maintained at an lower absolute pressure than in upper chamber 22. In both drum and span metalizing methods, film fabrication operating conditions and process variables are monitored and adjusted by an operator and/or computerized supervisory control system represented schematically by element 31.

It has thus been discovered that when substantially more heat than conventionally used to soften and emboss the film is suddenly supplied to the surface of the base layer-coating layer composite, micro-scale grooves will form. According to an aspect of this invention, localized heat can be added to the coating layer surface effectively by hot metal condensing on the surface during vapor metalization. Moreover, the heat appropriate to generate iridescence-producing grooves can be controlled by manipulating the rate of solid metal fed to the evaporators. That is, for a given composite web speed passing through a vacuum metalizing unit, faster solid metal feed will produce a hotter coating layer surface. Speeding or slowing wire feed to the boats of the metalizers described above relatively heats or cools, respectively, the composite such that grooves are formed without damaging the metalized film. For example, heating should not be so great that the surface of the completed film on the wind up roll 23 becomes tacky, distorts dimensionally during film handling or masses when wound up in a roll. Dry coat thickness is also a factor influencing groove formation. Preferably, the coating thickness should be optimized in the range of about 0.3-0.5 µm.

In another aspect, excess heat can be added to the web being metalized by slowing speed of the web passing across the slot. This technique is particularly effective in span metalization. In that case, slowing the web speed extends the duration of exposure of the web to hot metal vapor. This technique can be used with drum metalization although the heating effect from hot vapor exposure is lessened by the cooling effect of the drum. The cooling effect of the drum can be reduced by using higher temperature cooling water, and/or by slowing the rate of coolant through the drum.

In conventional span metalizing a previously mechanically impressed, groove-coated film, it is customary to move the film over the slot of the traverse plate at a higher speed than for conventional drum metalizing. Being a heat sink, the drum attenuates the effect of heat on the film. Without the cooling effect of the drum, damage to the film likely occurs if the film speed is the same as normal speed utilized for drum metalizing. That is, in traditional vacuum metalizing where iridescence-generating grooves are mechanically formed before metalization, the standard film speed of span metalizing is faster than the standard film speed of drum metalizing. However, running the film across the slot at the normal high speed for conventional span metalizing of a smooth coated film does not suitably heat the coated film surface sufficiently to produce grooves. For example, in span metalizing experiments such as Example 5, an iridescent effect was not seen at film metalizing speeds above 4.06 m/s (800 ft/min). It has been found that slower than standard film speeds should be used in span metalizing to produce iridescent grooves in the film coating.

If the film speed for span metalizing is too slow, the film can be heated far above the degree that produces grooves for iridescence and the film can be damaged. It is surprising that a smooth, (i.e., not mechanically impressed) coated film can be processed at borderline destructively overheated conventional conditions to achieve satisfactory, useful rainbow iridescent film.

In addition to only adjusting metal feed rate or film speed to obtain iridescence-generating grooves, a combination of both adjustments can be used. Other optional techniques for providing a suitable amount of excess heat can be employed to generate a rainbow iridescent effect by a non-mechanically grooved film coating. Such techniques include positioning the evaporation boats to bring them closer to the web than for conventional iridescent film fabrication. Other condition changes may assist producing grooves during metalizing, such as supplementing the heat provided by conventional metalizers, for example by deploying radiant heating elements inside the metalizer or heating the idler rollers. By applying the teachings of this disclosure, the artisan of ordinary skill should be able without undue experimentation to adjust the various metalizing operating conditions of a non-mechanically-grooved, coated film to obtain good iridescence-generating grooves without damaging the film.

It should be understood that the novel procedure distinctly differs from traditional iridescent film forming methods in that during the metalization step, the metal is deposited onto a smooth surface, uniformly thick coating layer and that interaction of the hot metal with the polymeric coating layer generates grooves capable of exhibiting iridescence on the film surface.

EXAMPLES

This invention is now illustrated by examples of certain representative embodiments thereof, wherein all parts, proportions and percentages are by weight unless otherwise indicated. All units of weight and measure not originally obtained in SI units have been converted to SI units.

Comparative Example 1

Metalizing a Non-Iridescent Film

A base layer film was formed by extruding a polyethylene terephthalate melt through a film forming die and subsequently biaxially stretching 4× in the machine direction and 4× in the transverse direction to a thickness of 12 µm. A coating layer liquid mixture was prepared by dispersing styrene acrylic polymer with a glass transition temperature (Tg) of 55° C., a coalescent, and a surfactant in deionized water to a 6% wet solids concentration. The liquid mixture composition was 49.0 parts by weight ("pbw") Setalux® 37-3372 styrene acrylic emulsion (Nuplex Resins LLC, Louisville, Ky.), 0.01 pbw Surfynol® 440 acetylenic surfactant (Air Products and Chemical, Inc., Allentown, Pa.). 1.2 pbw Dowanol PPH (Dow Chemical Company, Midland, Mich.) propylene glyol phenyl ether, and 49.0 pbw deionized water.

Continuously after extruding and stretching in the machine direction, a surface of the base layer was corona treated to increase the surface energy to about 50 dynes and thereby enhance the ability of the coating layer composition to "wet out" (i.e., spread uniformly on) the base layer surface. After the machine direction stretching, the coating layer liquid mixture composition was applied onto the treated polyester base layer surface by rod coating with a No. 3 Mayer rod. Continuously thereafter, the wet-coated polyester film was dried and stretched in the transverse direction in a tenter oven for approximately 15 seconds at a web speed of 3.0 m/s (600 feet/min). The coated film was simultaneously dried and oriented though a series of heating zones with successively increasing temperatures that reached a maximum temperature of 230° C. in the last zone. Thickness of the dried coating was approximately 0.3-0.4 µm.

The coated styrene acrylic polymer polyester film was wound up to a roll that was placed into a drum metalizing apparatus of the type illustrated in FIG. 2. The coated film was moved at speed of 4.06 m/s (800 ft./min.) and was vacuum metalized with aluminum by the drum metalizing process described above in which the upper chamber pressure was 100 Pa (1×10⁻² millibar), the lower chamber pressure was 0.04 Pa (4×10⁻⁴ millibar), the distance of the metal evaporators below the drum was 250 mm and the cooling drum temperature was −15° C. The aluminum wire was fed to the evaporators at a rate of about 5 g/min. The film exhibited a very bright reflective surface under fluorescent ceiling lights but was non-iridescent.

Comparative Example 2

Metalizing a Mechanically Embossed Iridescent Film

Figure 3:
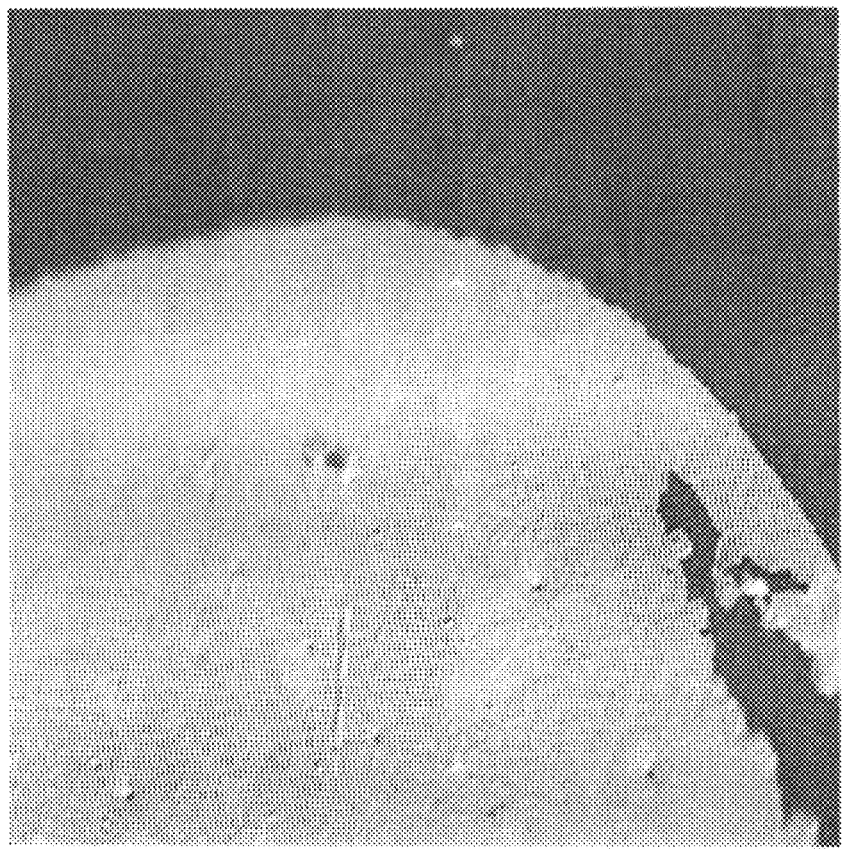
FIG. 3 is a photomicrograph at approximately 400 times magnification of a surface of a conventional aluminum metalized styrene acrylic polymer-coated, polyester base layer film according to Comparative Example 2 having grooves formed by embossing the styrene acrylic polymer-coated polyester film composite with a nickel diffraction pattern shim of 10,000 grooves/cm.

The procedure of Comparative Example 1 was repeated with the following changes. The coated styrene acrylic polymer coated polyester film was embossed using a nickel diffraction grating attached to a heated roller and having a pattern of 10,000 grooves per cm. The coated polyester film was run though this heated nip at speed of 0.10 m/s (20 ft./min,) temperature of 104° C. and pressure of 414 KPa (60 psi) in a laboratory hot roll laminator that transferred the diffraction image to the coated surface. The embossed coated film was then vacuum metalized using aluminum as in Comparative Example 1. After such treatment the aluminized film retained about 9,000 grooves/cm. The resulting rainbow image examined by visual inspection under fluorescent ceiling lights was very bright and highly iridescent. A photomicrograph at about 400 times magnification of the film produced is shown in FIG. 3.

Example 3

Non-Mechanically Grooved Iridescent Film by Slowing Metalizing Speed

The procedure of Comparative Example 2 was repeated except that the styrene acrylic polymer coated polyester film was not mechanically embossed and the rate of the web passing through the metalizing unit operation was 3.05 m/s (600 ft./min.). The slower web speed caused the coating to become rippled. Examination under fluorescent light revealed subdued, uniform iridescent effect.

Example 4

Non-Mechanically Grooved Iridescent Film by Increasing Metal Feed Rate

The procedure of Comparative Example 2 was repeated except that the styrene acrylic polymer coated polyester film was not mechanically embossed and the rate of aluminum fed to the metalization boats was increased by 20% to about 6 g/min. A thicker aluminum layer of greater than 450 angstroms (45 nm) was deposited on the coating layer, and accordingly, contributed additional heat to the film. Examination under fluorescent light revealed an iridescent effect.

Example 5

Non-Mechanically Grooved Iridescent Film by Span Metalization

Figure 4:
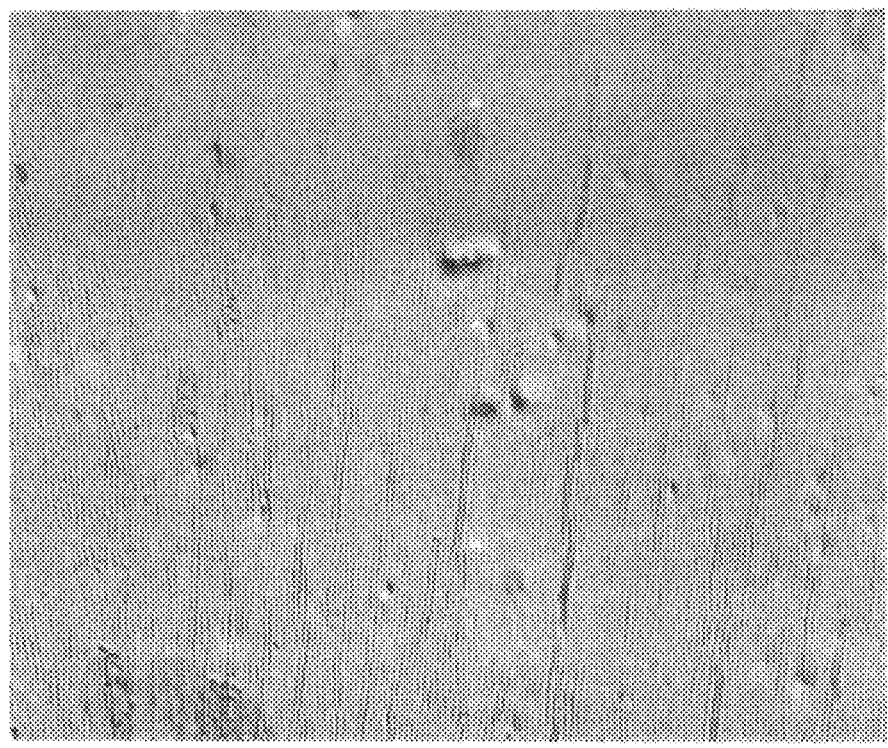
FIG. 4 is a photomicrograph at approximately 400 times magnification of a surface of a aluminum vacuum metalized styrene acrylic polymer-coated, polyester base layer film having grooves formed by the method of this invention as described more fully in Example 5.

The procedure of Comparative Example 2 was repeated except that the styrene acrylic polymer coated polyester film was not mechanically embossed and aluminum was deposited on the web by span metalization. With the cooling drum removed, the heat transferred to the film during the metalizing step caused the coating layer to become grooved. A photomicrograph at about 400 times magnification of the film produced is shown in FIG. 4. Count of the thermally created grooves was about 7,000 grooves/cm. The grooves produced by heating the web during metalization were comparable in appearance to those seen in FIG. 3 that were made by mechanically embossing the coating layer. Under fluorescent light the sample exhibited iridescence.

Although specific forms of the invention have been selected in the preceding disclosure for illustration in specific terms for the purpose of describing these forms of the invention fully and amply for one of average skill in the pertinent art, it should be understood that various substitutions and modifications which bring about substantially equivalent or superior results and/or performance are deemed to be within the scope and spirit of the following claims. The entire disclosures of U.S. patents and patent applications identified in this application are hereby incorporated by reference herein.

What is claimed is:

1. A method of producing a film that exhibits rainbow iridescence comprising the steps of
    (A) providing a base layer of a polymer having a softening temperature above 200° C.,
    (B) applying a coating layer of a coating polymer having a glass transition temperature in the range of about 30-55° C. in direct contact with one side of the base layer, and
    (C) depositing a metal layer in direct contact with the coating layer on a side opposite the base layer,
    in which the depositing step is effective to create a grooved surface profile on the coating layer having about 5,000-10,000 grooves per cm.

2. The method of claim 1 which excludes forming the grooves by mechanically embossing the film.

3. The method of claim 1 in which the base layer comprises polymer selected from the group consisting of polyimides, polysulfones, polycarbonates, polyesters, polyamides, polyureas, poly(ether-amides), poly(hydroxy acids), acrylic polymer, polyolefins, polyurethane and blends thereof.

4. The method of claim 3 in which the base layer is polyethylene terephthalate.

5. The method of claim 1 in which the coating polymer comprises polymerized styrene monomer.

6. The method of claim 5 in which the coating polymer further comprises a copolymerized acrylic comonomer derivative of acrylic acid.

7. The method of claim 1 in which the base layer and coating layer together form a web, and which method comprises vacuum metalizing a metal onto the coating layer of the web.

8. The method of claim 7 which comprises operating conditions selected from the group consisting of (i) feeding the metal to a metal evaporator at a metal feed rate, (ii) moving the web past the metal evaporator at a web speed, (iii) positioning the web at a distance from the evaporator, and (iv) a combination of (i)-(iii), in which the metal feed rate, web speed and distance are effective to cause the formation of 5,000-10,000 grooves/cm in the coating layer.

9. The method of claim 8 in which vacuum metalizing comprises drum metalizing.

10. The method of claim 8 in which vacuum metalizing comprises span metalizing.

11. The method of claim 7 which comprises stretching the web by about 100% to about 600% in a direction parallel to the plane of the web after applying the coating layer and before depositing the metal layer.

12. The method of claim 1 in which the coating polymer is polyolefin.

13. The method of claim 1 in which the depositing step comprises exposing the coating layer to a sudden, short, large burst of heat such that the grooved surface profile and the metal layer are formed simultaneously.

14. The method of claim 1 in which thickness of the coating layer is about 0.3 μm-0.5 μm.

* * * * *